United States Patent [19]
Hwang

[11] Patent Number: 5,517,159
[45] Date of Patent: May 14, 1996

[54] FREQUENCY MODULATING SYSTEM INCLUDING FEEDBACK CLAMPING CIRCUIT

[75] Inventor: Myoungchun Hwang, Incheon, Rep. of Korea

[73] Assignee: Samsung Electronics Co., Ltd., Suwon, Rep. of Korea

[21] Appl. No.: 427,581

[22] Filed: Apr. 24, 1995

Related U.S. Application Data

[62] Division of Ser. No. 160,873, Dec. 3, 1993.

[30] Foreign Application Priority Data

Dec. 3, 1992 [KR] Rep. of Korea .................. 92-23209

[51] Int. Cl.[6] .................. H03C 3/09; H03L 7/06; H04N 9/80
[52] U.S. Cl. .................. 332/127; 331/2; 348/724; 358/330; 360/30; 455/110; 455/119
[58] Field of Search .................. 331/2; 332/127; 360/30; 348/724, 642; 358/330; 455/110, 113, 119

[56] References Cited

U.S. PATENT DOCUMENTS

| 5,231,507 | 7/1993 | Sakata et al. | 358/330 |
| 5,267,023 | 11/1993 | Kawasaki | 332/123 |
| 5,347,240 | 9/1994 | Park | 332/127 |

Primary Examiner—Siegfried H. Grimm
Attorney, Agent, or Firm—Cushman Darby & Cushman

[57] ABSTRACT

A frequency modulating system for frequency-modulating an input signal with a predetermined carrier frequency comprising a controller circuit and a frequency modulator is provided. The controller circuit includes an automatic frequency detecting circuit, a voltage controlled oscillator, an error current generator, a feedback clamping circuit, a deviation current generator, and an adder circuit generating a frequency deviation/carrier frequency correction signal provided to the frequency modulator. The frequency modulator modulates the frequency in response to an output of the controller circuit and includes an oscillator having the same structure as that of the voltage controlled oscillator.

4 Claims, 6 Drawing Sheets synchronous signal (fH)

H-pulse gatepulse

H-pulse(b) + gate pulse(c)

FREQUENCY MODULATING SYSTEM INCLUDING FEEDBACK CLAMPING CIRCUIT

This is a division of application Ser. No. 08/160,873, filed Dec. 3, 1993.

BACKGROUND OF THE INVENTION (1) Field of the Invention

The present invention relates to a frequency modulating circuit. More particularly, it relates to a frequency modulating circuit which is automatically controlled without an operator for controlling a carrier during frequency modulation.

(2) Description of the Related Art

A video tape recording (VTR) system is capable of recording an audio signal and video information for replay when desired. In this system, video signals are stored as signals having a modulated frequency in recording media such as magnetic tapes.

When the video signals are stored on a magnetic tape, luminance signals are stored on the magnetic tape after frequency modulation. A frequency modulating circuit generally includes an oscillator formed of a resistor and a capacitor and a control system mounted outside to control the desired carrier frequency necessary for proper frequency modulation. The carrier frequency is externally adjusted with the use of a variable resistor. This external resistor produces a voltage control of the frequency of the oscillator. The variable resistor control and resistor/capacitor oscillator form a voltage controlled oscillator (VCO).

In general, a VCO is used with a phase detector that compares a reference signal of a predetermined carrier frequency with an output of the VCO which would otherwise oscillate freely. A phase difference is detected by the phase detector, which generates an error voltage corresponding to this phase difference. The phase difference is fed back to the VCO to control the output of the VCO to the reference frequency.

The frequency modulating circuit of the VTR conventionally has a VCO which modulates an input signal which is to be recorded. The carrier frequency of the frequency modulating circuit is controlled by using the error voltage obtained by the control loop of the VCO.

Conventionally, the frequency of the carrier frequency is precisely controlled by the manual adjustment of an external variable resistor. However, this conventional precision control of the carrier frequency has the disadvantage of raising the costs of production of the VTR. In addition, the manual adjustment of the variable resistor increases the probability of error in the control.

Further, there is the need for a circuit which generates a 3.4 MHz oscillating signal to be used as a reference signal. Also, the phase detector may generate a large amount of error in the circuit if the carrier frequency increases.

SUMMARY OF THE INVENTION

Therefore, the present invention provides an improved frequency modulating circuit with reduced production cost and enhanced precision. The frequency modulating circuit is self adjusting without the need for external control, which eliminates the additional assembly steps, imprecision and costs associated with the conventional manual adjustment method.

In order to achieve the above and other objects, the present invention discloses a frequency modulating system for frequency-modulating an input signal with a predetermined carrier frequency. The circuit includes an automatic frequency detecting circuit for comparing the phase of a constant frequency reference signal, which is lower than the carrier frequency, to the phase of a signal obtained by dividing the frequency more than several times. The circuit also includes a VCO and an error current generator which converts an output error voltage from the frequency detector circuit into a current.

The circuit includes a feedback clamping circuit for clamping the reference signal. The signal to be frequency-modulated is input to the feedback clamping circuit, as well as a reference voltage which determines the clamping level. A deviation current generator, also included in the frequency modulation circuit, has a transconductance circuit for amplifying and converting an output of the feedback clamping circuit into a current which corresponds to the output. An adder circuit adds the error current and the deviation current, producing a frequency deviation/carrier frequency correction control, which is then provided to a frequency modulator, which modulates the video signal.

BRIEF DESCRIPTION OF THE DRAWINGS

The scope of the present invention will be better understood by the ordinarily skilled person in the art from the detailed description of the invention with reference to the drawings, in which.

DETAILED DESCRIPTION OF PREFERRED EMBODIMENTS

Figure 1:
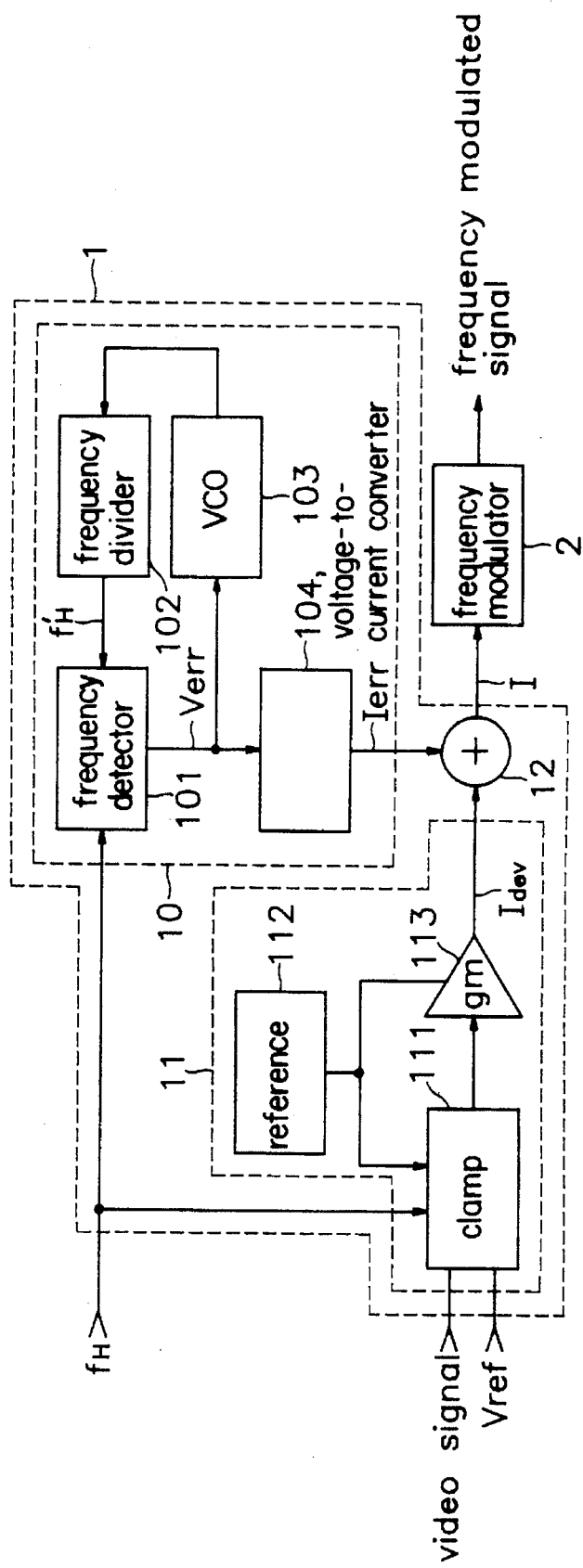
FIG. 1 is a block diagram of a frequency modulating system in accordance with the present invention.

FIG. 1 is a block diagram for showing a frequency modulating circuit in accordance with the present invention having a correction control circuit which automatically controls the carrier frequency of the frequency modulating circuit for use in recording a video signal on a magnetic tape. It is to be understood that while the invention is described with reference to recording video signals, the present invention is equally applicable to similar signals, e.g., audio signals.

A video signal is frequency-modulated by a frequency modulator 2 via a frequency correction controller 1. The frequency correction controller 1 includes an error current generator 10 and a deviation current generator 11. The output $I_{err}$ from the error current generator 10 and the output $I_{dev}$ from the deviation current generator 11 collect in adder 12 and are output as a correction control signal I.

The error current generator 10 receives an externally provided reference synchronous signal $f_H$. The reference synchronous signal $f_H$ may, for example, be derived from the video signal horizontal sync signal. An error current $I_{err}$ is generated by a voltage-to-current converter 104, which converts the error voltage $V_{err}$ into the error current $I_{err}$. A phase-locked loop (PLL) is formed by an automatic frequency detector 101, a frequency divider 102 and a voltage controlled oscillator 103.

The deviation current generator 11 generates a deviation current $I_{dev}$ via a feedback clamping circuit 111 receiving the synchronous signal $f_H$ and the video signal (video), a band gap reference circuit 112, and a transconductance amplifier 113 which operates as a voltage-to-current converter.

Figure 2:
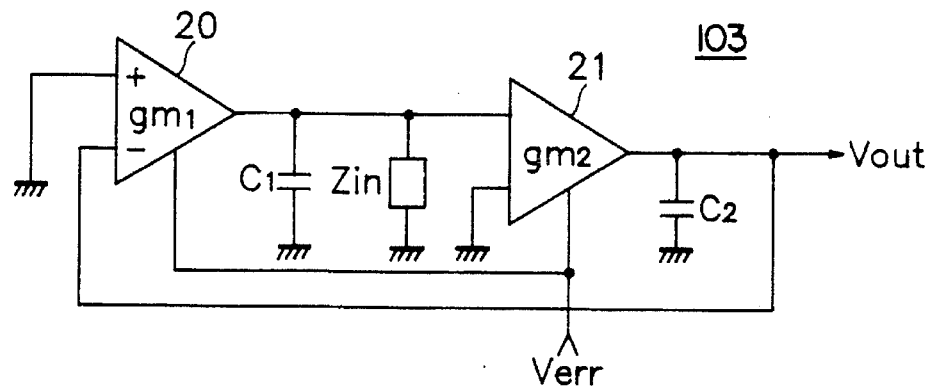
FIG. 2 is a detailed schematic diagram showing an example circuit of the voltage controlled oscillator of FIG. 1.

The PLL includes a VCO 103, which outputs a frequency signal in response to the error voltage $V_{err}$. The VCO of the preferred embodiment includes oscillating transconductance amplifiers (OTA) as shown in FIG. 2.

The VCO includes a first OTA 20 and a second OTA 21. An output $V_{out}$ of the second OTA 21 is fed back to the inverting input of the first OTA 20. A capacitor $C_1$ and an impedance circuit $Z_{in}$ are coupled to the output of the first OTA 20 and are input to an input terminal of the second oscillating amplifier 21. A capacitor $C_2$ is coupled to the output $V_{out}$ of the second OTA 21. The VCO 103 outputs a frequency three-hundred and twenty times that of the externally provided synchronous signal $f_H$.

The VCO includes an OTA filter formed from individual components, which produces an amount of freedom in the filtering of the signal by the choice of components. Since the OTA filter can change the transconductance and vary an oscillating frequency, it is suitable for the free adjustment of the oscillating frequency by the selection of components having constant characteristics, such as a resistor. A plurality of filters can be controlled collectively. The OTA filter forms an oscillator, and when the oscillation frequency changes for reasons such as thermal changes, the amount of variation in the oscillating frequency of the VCO 103 becomes similar to any changes occuring in the frequency modulator 2.

The VCO 103 of the error current generator 10 has a frequency of, e.g., 5.04 MHz. The 5.04 MHz signal is input to the frequency divider circuit 102 which divides the input signal by 320 to be similar to the synchronous signal $f_H$. The output of the 1/320 frequency divider is provided to the frequency detecting circuit 101. The frequency detecting circuit compares the divided signal output from the frequency divider circuit 102 with the synchronous signal $f_H$ supplied externally. If the signals do not accord with each other, an error voltage $V_{err}$ is generated in response to the phase difference. The error voltage $V_{err}$ is input to the VCO 103 to automatically control the oscillation of the VCO 103 at 5.04 MHz. The error voltage $V_{err}$ is also input to the voltage-to-current converter 104, where it is converted and output as a corresponding amount of error current $I_{err}$.

Accordingly, an oscillator having the same structure as the VCO 103 is included in the frequency modulator 2, and therefore oscillates exactly as desired. That is, e.g., at a frequency of 3.4 MHz in accordance with the system of the preferred embodiment. The carrier frequency of the frequency modulator 2 may be automatically controlled from the outside.

It will be appreciated that factors which may cause a change in frequency of the VCO in the frequency modulator 2 (e.g. temperature), will cause a similar change in the VCO 103 of the frequency correction controller 1. The phase lock loop of the frequency correction controller 1 will generate a correction signal Verr which holds both VCOs to a desired frequency.

Referring now to the VCO 103 of FIG. 2, biquad filters formed of two OTAs are configured as a band pass filter (BPF) so that the VCO oscillates by means of the negative feedback of the output $V_{out}$ to the inverting input of the first OTA 20 and the negative resistance Zin. A transconductance value gm of the VCO 103 in the frequency converter and a trans-conductance value gm of the BPF are formed in the same manner, and a selectivity value Q is chosen to be large so that the VCO is stable. A propagation function of the VCO 103 is expressed as:

$$V_o = \left( S - \frac{gm}{C} \right) \left( S^2 + \frac{G}{C_1} S + \frac{gm_1 gm_2}{C_1 \times C_2} \right)$$

where G is an equivalent conductance, $\omega_o$ is $$\frac{gm_1 gm_2}{C_1 \times C_2},$$

$$f_o = \frac{\omega_0}{2\pi} = \frac{gm_1 gm_2}{2\pi C_1 C_2}$$

$f_o$ is a value of an output current controlled by a voltage input and is variable according to the transconductance value, gm. The output current is formed to have the same structure as the output current of the filter circuit, and if the VCO is controlled at a predetermined frequency, $\omega_o$ of the frequency modulator is also controlled by the output current. That is, a current is supplied by $I_{err}$, and the frequency modulator 2 can be operated as discussed above.

The oscillating frequency of the VCO 103, which is 320 times that of the synchronous signal $f_H$, is input to the frequency divider circuit 102 for division by 320 to a frequency of the synchronous signal $f_H$. The frequency divider circuit 102 includes a counter formed of flip-flop circuits to generate the output signal.

An automatic frequency detecting circuit 101 phase-compares the divided signal from the frequency divider circuit 102 with the synchronous signal $f_H$, which generates an error voltage $V_{err}$ by the method discussed below.

Figure 3A:
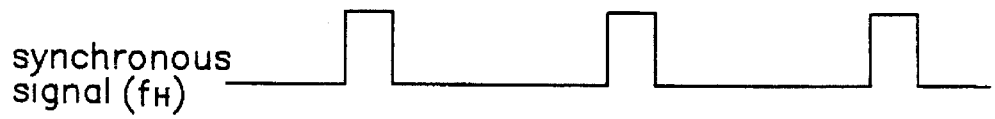
FIGS. 3A to 3D are waveform charts for depicting the operation of the frequency detector circuit of FIG. 1.
Figure 3B:
Figure 3C:
Figure 3D:

FIGS. 3A to 3D show wave forms relating to the operation of the frequency detector 101. An H-pulse having a 60% duty cycle is formed as shown in FIG. 3B. A gate pulse for demodulating the PLL is formed as shown in FIG. 3C, simultaneously with the division of the output of the VCO. A demodulated output is obtained by gating the H-pulse with the gate pulse, as shown in FIG. 3D. An integration is performed by an integrator, which then generates the error voltage $V_{err}$.

The error voltage $V_{err}$ controls the oscillation frequency of the VCO 103. For example, if the initial oscillating frequency of the VCO 103 is lower than the synchronous signal $f_H$, then the period of the gate pulse of FIG. 3C is increased, which increases the upper portion of the gated signal shown in FIG. 3D. Accordingly, the output of the frequency divider 102 becomes higher and raises the oscillating frequency of the VCO 103. Therefore, the upper portion of the demodulated output becomes similar to the lower portion of the demodulated output. At this time the phase comparison of the signals are equal, and the PLL is considered 'locked'. The error voltage $V_{err}$ is converted to an error current $I_{err}$ by the voltage-to-current converter 104.

The frequency modulator 2 is structurally the same as the VCO 103, and controls the frequency of oscillation the same way as it does the VCO 103. Thus, the VCO 103 can oscillate as desired.

Before the video signal is applied to the present circuit, the peak amplitude of the video signal is formed to be aligned at a constant electrical potential, and the peak amplitude of the signal is again aligned to a constant electrical potential in a feedback clamp circuit (FBC) 111. The voltage-to-current converter 113 generates a deviation current $I_{dev}$ which is proportional to the peak aligned video signal. The deviation current $I_{dev}$ is added to the error current $I_{err}$ in the adder circuit 12, which generates a correction control signal I which controls the carrier frequency and the deviation in the frequency of the frequency modulator. The peak-aligned level and a white level of the video signal are modulated respectively to 3.4 MHz and 4.4 MHz.

Figure 4:
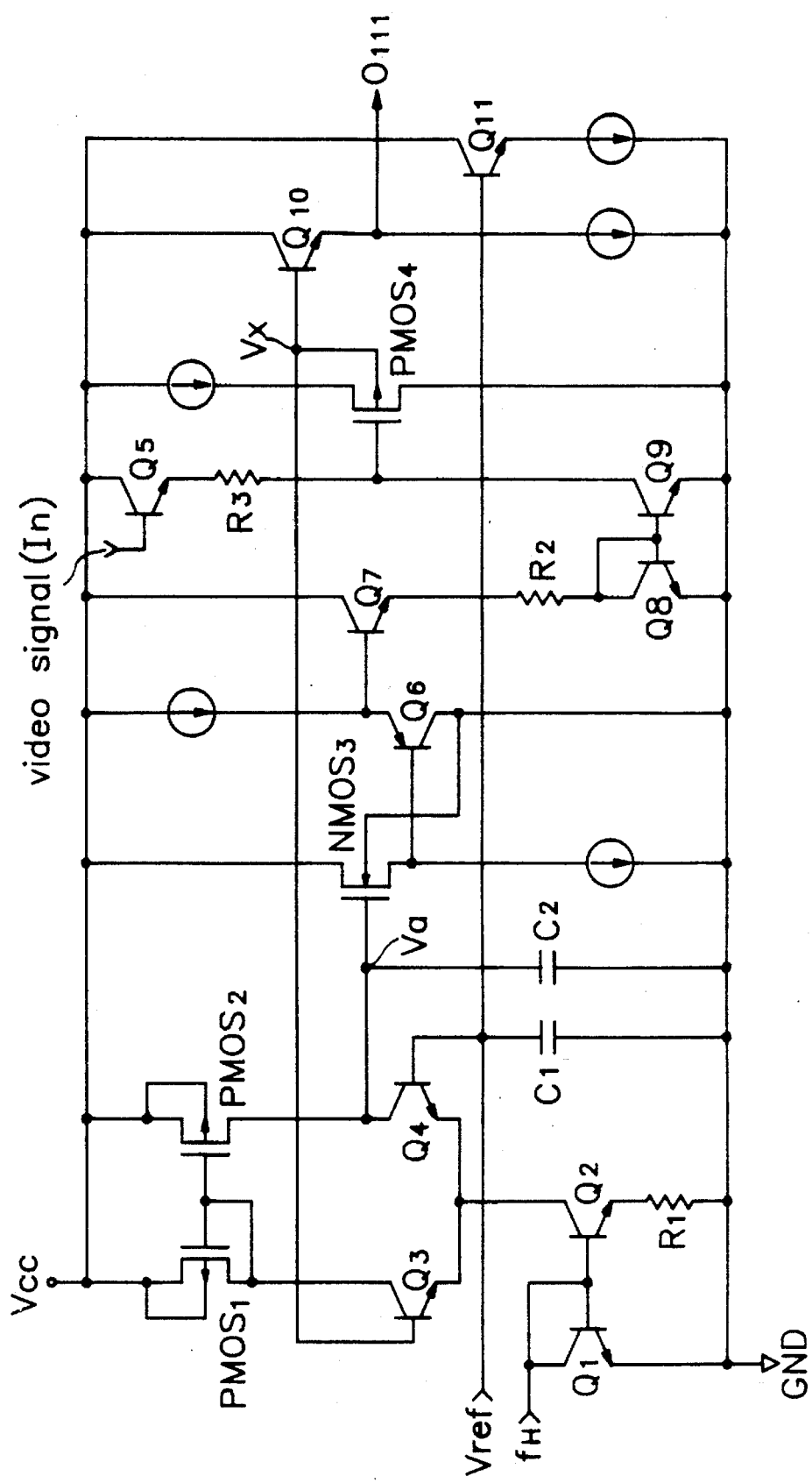
FIG. 4 is a detailed schematic diagram showing an example circuit of the feedback clamping circuit in FIG. 1.
Figure 6:
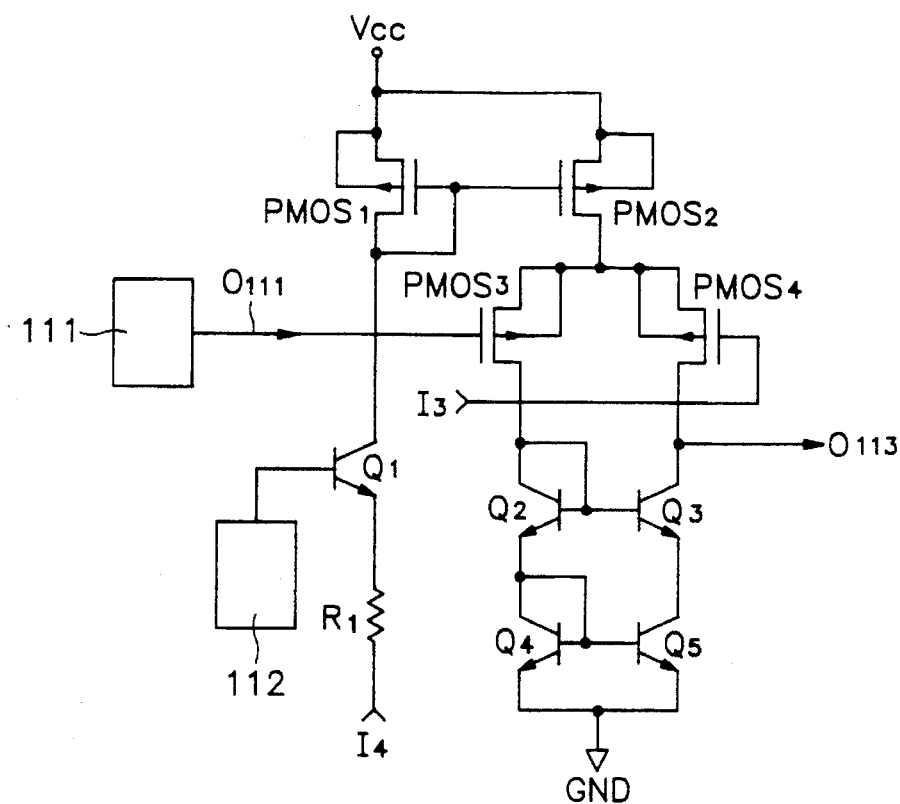
FIG. 6 is a detailed schematic diagram showing an example circuit of a transconductance amplifier.

One detailed example of a circuit forming the feedback clamping circuit 111 is depicted in FIG. 4, and an example of the transconductance amplifier 113 is depicted in FIG. 6.

The feedback clamping circuit 11 clamps the peak amplitude of an input video signal $I_n$ to a predetermined voltage level. A synchronous signal $f_H$ is input to the feedback clamping circuit 111. Transistors $Q_3$ and $Q_4$ are connected to the collector of transistor $Q_2$ which receives the synchronous signal $f_H$ at it's base. A reference voltage $V_{ref}$ is input as the voltage level at which the peak amplitude of the input video signal $I_n$ is to be clamped. The input video signal $I_n$ is applied to base of transistor $Q_3$ via a p-type metal oxide semiconductor transistor (PMOS) $PMOS_4$. The collector voltage $V_a$ of transistor $Q_4$ is changed in accordance with the potential of the peak-amplitude of the video signal which is applied to base of transistor $Q_3$. If the voltage level of the peak-amplitude of the video signal is lower than the reference input voltage $V_{ref}$, then the current flowing via transistor $Q_4$ is increased, and the capacitor $C_2$ connected between the collector of the transistor $Q_4$ and ground (GND) discharges via transistor $Q_4$. Accordingly, the collector voltage $V_a$ of transistor $Q_4$ drops and current flows in the emitter of transistor $Q_7$. The voltage of the gate of transistor $PMOS_4$ rises, raising the voltage $V_x$, and thus operates to bring $V_x$ to the same level as the reference voltage $V_{ref}$.

On the contrary, if the voltage level of the peak-amplitude of the input video signal $I_n$ is higher than the reference voltage $V_{ref}$, the capacitor $C_2$ is charged and the collector voltage $V_a$ of transistor $Q_4$ rises, increasing the emitter current of transistor $Q_7$. Thus, the voltage at $V_x$ is lowered to become equal to the reference voltage $V_{ref}$.

Figure 5:
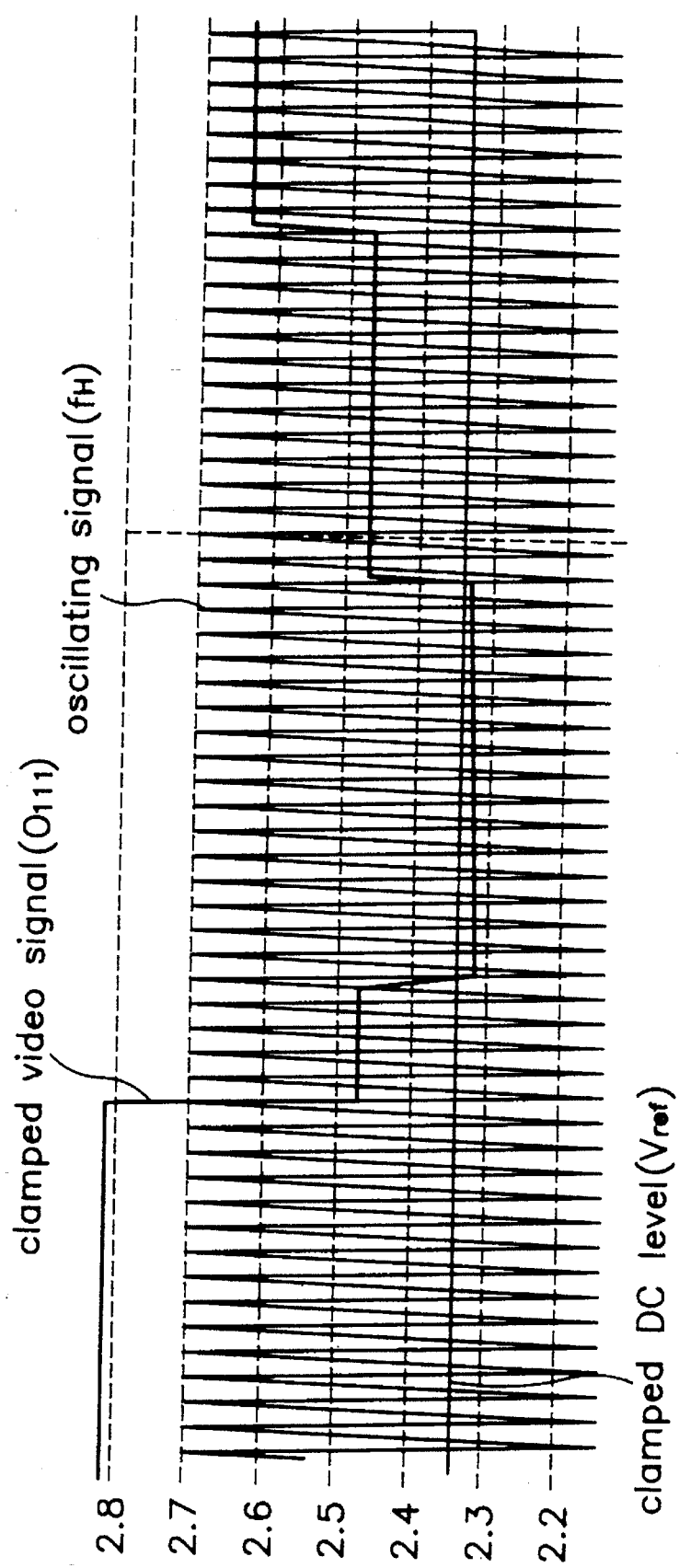
FIG. 5 shows an output waveform chart of the feedback clamping circuit of FIG. 4.

FIG. 5 is a wave form chart of the feedback clamping circuit 111 and illustrates an oscillating synchronous signal $f_H$, the voltage reference $V_{ref}$ which determines the level to which the input video signal will be clamped, and a clamped video signal $O_{111}$.

An output of the band gap reference circuit 112 provides a bias to the current sources of the feedback clamping circuit 111. An output of the feedback clamping circuit 111 is input to a transconductance amplifier 113 as shown in FIG. 1. An example of the transconductance amplifier 113 is shown schematically in FIG. 6. A band gap reference circuit 112 provides a stable bias source from temperature changes, and applies a constant voltage to the base of transistor $Q_1$. A constant current flows in transistor $Q_1$ so long as the external input $I_4$ applied to the emitter of transistor $Q_1$ does not change.

The clamped video signal $O_{111}$ output from the feedback clamping circuit 111 is applied to a transistor $PMOS_3$, and a constant voltage $I_3$ is applied to transistor $PMOS_4$. $PMOS_3$ is connected symmetrically with transistor $PMOS_4$. When the clamped video signal $O_{111}$ is the same as the constant voltage $I_3$, the output $O_{113}$ becomes zero.

This circuit generates a deviation current $I_{dev}$ which is proportional to the voltage level of the input video signal to control the frequency deviation of the frequency modulator 2.

An error current $I_{err}$ is added to the deviation current $I_{dev}$ in the adder circuit 12 and input to the frequency modulator 2. A generated frequency-modulated signal is shown in FIG. 7.

The frequency modulator has an oscillator having the same structure as the VCO 103 of the error current generator 10. The error voltage $V_{err}$ is applied equally to the frequency modulator 2 as well as to the VCO 103 to obtain a carrier frequency which is controlled automatically. When the error current $I_{err}$ and/or the deviation current $I_{dev}$ change, a gm value of the OTA in the frequency modulator 2 also changes, and therefore the oscillating frequency changes.

Figure 7:
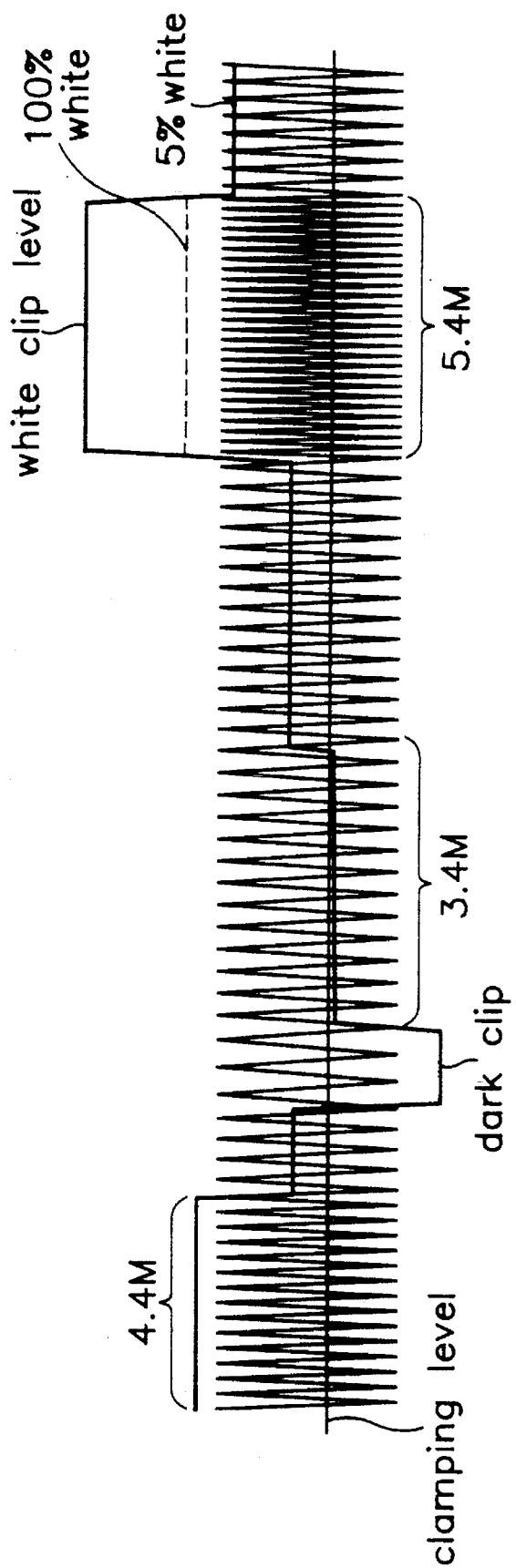
FIG. 7 shows an output waveform chart of the present invention.

FIG. 7 illustrates the frequency-modulated signals that are formed in accordance with various frequencies of input video signals. Frequencies corresponding to the level of video signals are illustrated. A dark clip region which is the lowest level and a white clip region which is the uppermost level are shown.

Figure 8:
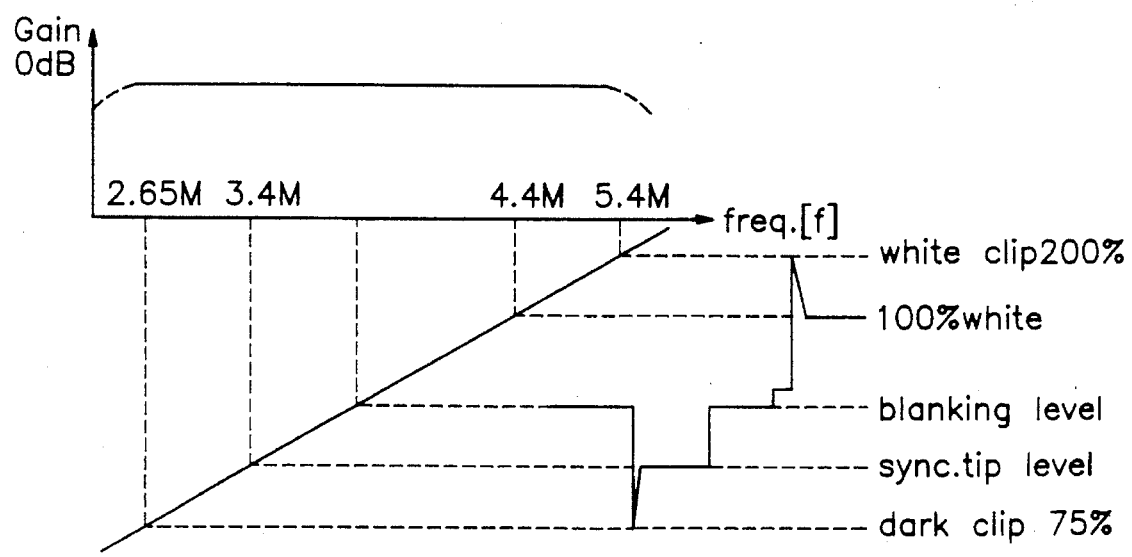
FIG. 8 is a graph showing the relationship between an input signal and the amount that the corresponding frequency is modulated.

Frequency levels corresponding to the levels of video signals are shown in the graph of FIG. 8. It is shown that, for example, a dark clip level of 75% becomes 2.65 MHz at the time of frequency modulation.

A second oscillator for oscillating a frequency of 3.4 MHz is not necessary by applying the OTA of the present invention. In addition, since the input frequency signal is compared to a synchronous signal, a high degree of accuracy in the detection of the phase to obtain a correct error voltage $V_{err}$ is conventionally difficult at the frequency of the input signal. Therefore, the present invention provides for a phase comparison to be carried out at a much lower frequency. For instance with the synchronous signal $f_H$ at 15.625 kHz, making possible a more exact phase comparison.

Therefore, the present invention provides for a control in the degree of accuracy of the frequency modulation by including a circuit capable of controlling small deviations in the frequency due, inter alia, to the instabilities of components.

Although preferred embodiments of the present invention have been described in detail hereinabove, it should be clearly understood by those skilled in the art that many variations and/or modifications of the basic inventive concepts herein taught are within the spirit and scope of the present invention, as defined in the appended claims.

What is claimed is:

1. A frequency modulation system for frequency-modulating an input signal with a predetermined carrier frequency including a controller portion and a frequency modulator portion, said controller portion comprising:

voltage controlled oscillator means for generating a VCO frequency which is greater than a reference frequency signal, said frequency varying in response to an input error voltage signal;

frequency divider means for dividing said VCO frequency having a frequency divided output;

automatic frequency detecting means for comparing a phase of said reference frequency signal having a frequency lower than said carrier frequency with a phase of said frequency divided output, said automatic frequency detecting means generating said error voltage signal; and voltage-to-current converter means for converting said error voltage signal to an error current signal;

an oscillator in said frequency modulator portion having substantially similar structure as that of said voltage controlled oscillator means;

feedback clamping means for clamping said reference frequency signal and said input signal to be frequency-modulated in accordance with a clamping level reference voltage, said feedback clamping means including:

a differential amplifying stage having a first and a second transistor and having input said clamping level reference voltage and said input signal to be frequency-modulated, a capacitor for charging and discharging electricity coupled between a collector of said second transistor and a ground, a third transistor coupled between said ground and a power source, said third transistor having an emitter current which increases and decreases in response to a variation in the voltage across said capacitor, and a PMOS transistor having a gate receiving said input signal and equalizing a source voltage and reference voltage in response to said third transistor;

deviation current generator means including a transconductance circuit for amplifying and converting an output of said feedback clamping means into a current deviation signal; and adder means for combining said error current signal with said current deviation signal and for generating a frequency deviation/carrier frequency correction control signal;

said frequency modulator portion modulating frequency in response to said frequency deviation/carrier frequency correction control signal.

2. A frequency modulation system for frequency-modulating an input signal with a predetermined carrier frequency including a controller portion and a frequency modulator portion, said controller portion comprising:

a voltage controlled oscillator generating a VCO frequency which is greater than a reference frequency signal, said frequency varying in response to an input error voltage signal;

a frequency divider dividing said VCO frequency having a frequency divided output;

an automatic frequency detector comparing a phase of said reference frequency signal having a frequency lower than said carrier frequency with a phase of said frequency divided output, said automatic frequency detector generating said error voltage signal; and a voltage-to-current converter converting said error voltage signal to an error current signal;

an oscillator in said frequency modulator portion having substantially similar structure as that of said voltage controlled oscillator;

a feedback clamping circuit clamping said reference frequency signal and said input signal to be frequency-modulated in accordance with a clamping level reference voltage, said feedback clamping circuit including:

a differential amplifying stage having a first and a second transistor and having input said clamping level reference voltage and said input signal to be frequency-modulated, a capacitor for charging and discharging electricity coupled between a collector of said second transistor and a ground, a third transistor coupled between said ground and a power source, said third transistor having an emitter current which increases and decreases in response to a variation in the voltage across said capacitor, and a PMOS transistor having a gate receiving said input signal and equalizing a source voltage and reference voltage in response to said third transistor;

a deviation current generator including a transconductance circuit for amplifying and converting an output of said feedback clamping circuit into a current deviation signal; and an adder combining said error current signal with said current deviation signal and generating a frequency deviation/carrier frequency correction control signal;

said frequency modulator portion modulating frequency in response to said frequency deviation/carrier frequency correction control signal.

3. A feedback clamping circuit clamping a reference frequency signal and an input signal to be frequency-modulated in accordance with a clamping level reference voltage, said feedback clamping circuit including:

a differential amplifying stage having a first transistor and a second transistor and having input said clamping level reference voltage and said input signal to be frequency-modulated;

a capacitor for charging and discharging electricity coupled between a collector of said second transistor and a ground;

a third transistor coupled between said ground and a power source, said third transistor having an emitter current which increases and decreases in response to a variation in voltage across said capacitor; and a transistor having a gate receiving said input signal and equalizing a source voltage and reference voltage in response to said emitter current of said third transistor.

4. A feedback clamping circuit clamping a reference frequency signal and an input signal to be frequency-modulated in accordance with a clamping level reference voltage, said feedback clamping circuit including:

differential amplifying means including first transistor means and second transistor means and having input said clamping level reference voltage and said input signal to be frequency-modulated;

a capacitor for charging and discharging electricity coupled between a collector of said second transistor means and a ground;

third transistor means, coupled between said ground and a power source, for providing a signal which increases and decreases in response to a variation in voltage across said capacitor; and fourth transistor means, receiving said input signal, for equalizing a source voltage and reference voltage in response to said signal provided by said third transistor means.

* * * * *